(12) United States Patent
Brocato

(10) Patent No.: US 7,397,301 B1
(45) Date of Patent: Jul. 8, 2008

(54) PYROELECTRIC DEMODULATING DETECTOR

(75) Inventor: Robert W. Brocato, Sandia Park, NM (US)

(73) Assignee: Sandia Corporation, Albuquerque, NM (US)

(*) Notice: Subject to any disclaimer, the term of this patent is extended or adjusted under 35 U.S.C. 154(b) by 166 days.

(21) Appl. No.: 11/431,776

(22) Filed: May 10, 2006

(51) Int. Cl.
*H03D 1/00* (2006.01)
(52) U.S. Cl. .................................. 329/347; 250/338.3
(58) Field of Classification Search ............... 329/347; 250/338.3
See application file for complete search history.

(56) References Cited

U.S. PATENT DOCUMENTS

| 4,218,620 | A | * | 8/1980 | Oettel ..................... 250/338.3 |
| 4,379,971 | A | * | 4/1983 | Smith et al. ................. 250/342 |
| 4,415,806 | A | * | 11/1983 | Tar ........................ 250/339.15 |
| 6,339,221 | B1 | * | 1/2002 | Schubring et al. ........ 250/338.3 |
| 6,599,362 | B2 | | 7/2003 | Ashby et al. |

OTHER PUBLICATIONS

R. W. Whatmore, "Pyroelectric devices and materials" Reports on Progress in Physics, vol. 49, 1986, pp. 1335-1386.
A. Majumdar, "Microscale Heat Conduction in Dielectric Thin Films", Journal of Heat Transfer, vol. 115, Feb. 1993, pp. 7-16.
D. Dimos, "Ferroelectric Thin Films for Photonics: Properties and Applications," Annual Reviews of Material Science, vol. 25, 1995, pp. 273-293.

T. G. Cooney et al, "Processing of sol-gel derived PZT coatings on non-planar substrates," Journal of Micromechanical, Microengineering, vol. 6, 1996 pp. 291-300.
Norio Fujitsuka et al, "Monolithic pyroelectric infrared image sensor using PVDF thin film," Transducers '97, 1997 International Conference on Solid-State Sensors and Actuators, Chicago, Jun. 16-19, 1997, pp. 1237-1240.
O. Ambacher, et al, "Growth and applications of Group III-nitrides," Journal of Physica D: Applied Physics, vol. 31, 1998, pp. 2653-2710.
William Sam Wong, "Integration of GaN Thin Films with Dissimilar Substrate Materials by Wafer Bonding and Laser Lift-Off," A Dissertation, University of California, Berkeley, 1999, pp. 58-72.
M.S. Shur et al, "Pyroelectric and Piezoelectric Properties of GaN-Based Materials," Proceedings of Symposium of MRS Gallium Nitride and Related Alloys, Dec. 1999, pp. 1-12.
Carol I. H. Ashby et al, "Low-dislocation-density GaN from a single growth on a textured substrate," Applied Physics Letters, vol. 77, No. 20, (2000), pp. 3233-3235.

(Continued)

*Primary Examiner*—Robert J. Pascal
*Assistant Examiner*—Levi Gannon
(74) *Attorney, Agent, or Firm*—John P. Hohimer

(57) ABSTRACT

A pyroelectric demodulating detector (also termed a pyroelectric demodulator) is disclosed which utilizes an electrical resistor stacked upon a pyroelectric element to demodulate an rf or microwave electrical input signal which is amplitude-modulated (AM). The pyroelectric demodulator, which can be formed as a hybrid or a monolithic device, has applications for use in AM radio receivers. Demodulation is performed by feeding the AM input signal into the resistor and converting the AM input signal into an AM heat signal which is conducted through the pyroelectric element and used to generate an electrical output signal containing AM information from the AM input signal.

21 Claims, 4 Drawing Sheets

OTHER PUBLICATIONS

Paul Muralt, "Micromachined infrared detectors based on pyroelectric thin films", Report on Progress in Physics, vol. 64 (2001), pp. 1339-1388.

M.S. Shur et al, "Wide band gap electronic devices (keynote)", Fourth IEEE International Caracas Conference on Devices, Circuits and Systems, Aruba, Apr. 17-19, 2002, pp. 1-8.

A.A. Talin et al, "Epitaxial $PbZr_{.52}Ti_{.48}O_3$ films on $SrTiO_3/(001)$ Si substrates deposited by sol-gel method", Applied Physics Letters, 2002, pp. 1062-1064.

William B. Tiffany, "The Amazing Versatile Pyroelectric", http://www.coherentinc.com/Applications/index.cfm.

D.Y. Tzou, *Macro- to Microscale Heat Transfer The Lagging Behavior*, Taylor & Francis, 1996, pp. 1-34.

* cited by examiner

PYROELECTRIC DEMODULATING DETECTOR

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to pyroelectric devices, and in particular to a pyroelectric demodulating detector (also referred to herein as a pyroelectric demodulator) for demodulating an amplitude-modulated electrical signal.

BACKGROUND OF THE INVENTION

Amplitude demodulation of high-frequency radio signals received by an antenna in a radio receiver is conventionally performed using a mixer or diode demodulator which operates in a nonlinear regime. The mixer or diode demodulator has an electrical output response $\Phi_{out}$ that can be generally characterized in terms of its input signal $\Phi_{in}$ by a Taylor series expansion:

$$\Phi_{out} = a_0 + a_1\Phi_{in} + a_2\Phi_{in}^2 + a_3\Phi_{in}^3 + a_4\Phi_{in}^4 + \ldots$$

where the input signal $\Phi_{in}$ can be amplitude modulated and characterized as a sinusoidal carrier having a time varying multiplying factor which contains information to be transmitted:

$$\Phi_{in} = b_0(1+m_0 \cdot m(t))\cos(\omega_c t)$$

where $\omega_c$ is the carrier frequency expressed in radians per second and is related to the carrier frequency $f_c$ expressed in Hertz by $\omega_c = 2\pi f_c$.

When this amplitude-modulated (AM) input signal $\Phi_{in}$ is passed through a conventional diode demodulator (also termed a "square-law" detector), the Taylor series expansion above is invoked, but only the squared term is useful to provide a demodulated output signal for recovery of the AM information. The squared term appears as:

$$\Phi_{out} = a_2 \frac{b_0^2}{2}[1+\cos(2\omega_c t)] \cdot [1+2m(t)+m^2(t)]$$

In the above equation, the $\cos(2\omega_c t)$ term is filtered out by an RC filter formed by the "square-law" detector's output resistance and video capacitance, or by the use of an external filter. The resulting "square-law" detector output is then given by:

$$\Phi_{out} = a_2 \frac{b_0^2}{2}[1+2m(t)+m^2(t)]$$

The efficiencies of this "square-law" detection process are twofold. First, the coefficient $a_2$ reduces the available power in the output signal $\Phi_{out}$ from the "square-law" detector to a small fraction of the power in the input signal $\Phi_{in}$. Second, filtering out the $\cos(2\omega_c t)$ term becomes increasingly difficult as the modulation bandwidth of the amplitude-modulated m(t) signal containing the information being transmitted becomes a significant fraction of the carrier frequency $\omega_c$. For ultra-wide-band (UWB) signals the modulation bandwidth must be at least 25% of the carrier frequency $\omega_c$ to satisfy Federal Communications Commission (FCC) requirements.

The above analysis shows that conventional diode demodulators based on "square-law" detection are inefficient. In a conventional passive diode demodulator and filter combination, the insertion loss can be about −40 dB, or even lower. For a powered diode demodulator, the insertion loss can be reduced; but the overall power required including that for powering the diode demodulator can result in a ratio of receiver output power to total power which is on the order of −50 dB.

Similar losses can occur when a mixer is used for demodulation. In this case, the input signal $\Phi_{in}$ is multiplied by a local oscillator signal $\cos(\omega_{LO}t)$ in the mixer to provide an output signal $\Phi_{out}$ given by:

$$\Phi_{out} = b_0[1+m(t)\cos(\omega_c t)] \cdot \cos(\omega_{LO}t)$$

The mixer generates up-converted and down-converted signal components in the output signal $\Phi_{out}$ as follows:

$$\Phi_{out} = b_0\left[\cos(\omega_{LO}t) + \frac{m(t)}{2}\{\cos[(\omega_{LO}-\omega_c)t] + \cos[(\omega_{LO}+\omega_c)t]\}\right]$$

When the mixer frequency $\omega_{LO}$ is equal to the carrier frequency $\omega_c$, the output signal $\Phi_{out}$ is demodulated as:

$$\Phi_{out} = \frac{b_0}{2}m(t)$$

The output signal $\Phi_{out}$ is reduced by at least 6 dB in this process, assuming perfect filtering. If the modulation bandwidth approaches the bandwidth of the input signal $\Phi_{in}$, the demodulated output signal $\Phi_{out}$ will be attenuated even more. Additionally, most receivers use multiple mixer and filter stages which can also reduce the output signal $\Phi_{out}$. Furthermore, the above analysis assumes perfect multiplication; whereas, in practice, the multiplication is accomplished by means of a nonlinear interaction induced by using the local oscillator to drive an active device into a nonlinear regime. This produces the same Taylor series expansion described above for the diode demodulator based on "square-law" detection so that the efficiency of mixing can be comparable to that of the diode demodulator particularly for low-level input signals.

Other conventional demodulation schemes are essentially more complicated than those described above. A phase-locked loop demodulator behaves like a mixer in terms of its efficiency. Radio-frequency (rf) power detectors are generally diodes or linear conversion sensors and provide an insertion loss which is similar to the diode demodulator.

In conventional demodulators, the desired output signal containing information which has been impressed upon a carrier signal using amplitude modulation is only a small fraction of the receiver input signal so that the signal detection process is inefficient. Additionally, the problem of separating an AM information signal m(t) from the carrier frequency $\omega_c$ becomes very difficult and very inefficient as the frequency of the information signal m(t) approaches the carrier frequency $\omega_c$. For a UWB signal with a 25% modulation bandwidth, the detection problem is profoundly inefficient. What is needed is a more efficient type of demodulator which can be used to demodulate signals over a wide frequency range up to several GigaHertz (GHz) or more.

The present invention is a pyroelectric demodulator which operates passively to demodulate an AM electrical input signal to remove modulation at the carrier frequency $\omega_c$ and generate an electrical output signal containing the AM information.

These and other advantages of the present invention will become evident to those skilled in the art.

SUMMARY OF THE INVENTION

The present invention relates to a pyroelectric demodulator for demodulating an amplitude-modulated (AM) electrical input signal to remove modulation at a carrier frequency and recover AM information. The pyroelectric demodulator comprises an electrical resistor to receive the AM electrical signal and to generate therefrom an AM heating signal in the electrical resistor which is substantially free from any signal at the carrier frequency; and a pyroelectric element in thermal communication with the electrical resistor to receive the AM heating signal and to generate therefrom an electrical output signal containing the AM information.

The pyroelectric demodulator can further comprise a substrate, with the pyroelectric element being in thermal communication with the substrate. The substrate can comprise, for example, silicon, silicon carbide, diamond, sapphire, ceramic or metal.

One side of the pyroelectric element can be attached to the substrate which acts as a heatsink; and the electrical resistor can be attached to another side of the pyroelectric element to act as a heat source. A pair of electrical input connections for providing the AM electrical signal to the electrical resistor can be suspended, at least in part, above the substrate to prevent a heat signal generated by the electrical resistor from bypassing the pyroelectric element. One or more electrical output connections from the pyroelectric element can also be suspended, at least in part, above the substrate to prevent the heat signal generated by the electrical resistor from being conducted through the electrical output connections and thereby bypassing the pyroelectric element.

The electrical resistor can comprise a layer of a resistive material such as tantalum nitride, nickel chromium (also termed nichrome), gold, copper, aluminum, tungsten or doped polycrystalline silicon. The layer of the resistive material can be located on a major surface of the pyroelectric element and electrically insulated therefrom by an intervening electrically-insulating layer (e.g. comprising a thin layer of silicon nitride, silicon dioxide or an adhesive such as epoxy). The electrical resistor can have a resistance substantially equal to 50 Ohms.

The pyroelectric element can comprise a pyroelectric material such as gallium nitride, lithium tantalate, lead zirconate titanate (PZT), lead lanthanum zirconate titanate (PLZT), polyvinylidene fluoride (PVDF), triglycine sulfate (TGS), or sodium nitrite (NaNO$_2$). The pyroelectric element can comprise a pyroelectric material with a thickness of $\leq 2$ microns when used to demodulate an rf or microwave electrical signal. In certain embodiments of the present invention, the pyroelectric element can be directly supported on the substrate. In other embodiments of the present invention, the pyroelectric element can be supported on a cantilever.

The AM information can have a carrier frequency up to about 10 GHz depending upon the size of the pyroelectric element. For UWB communications, the modulation bandwidth can be at least twenty-five percent of the carrier frequency.

The present invention also relates to a pyroelectric demodulator for demodulating an AM rf or microwave electrical signal to recover AM information therefrom. The pyroelectric demodulator comprises a pyroelectric element having a pair of major surfaces; a heat sink in thermal communication with one of the pair of major surfaces of the pyroelectric element; and an electrical resistor in thermal communication with the other of the pair of major surfaces of the pyroelectric element to receive the AM rf or microwave electrical signal and to generate therefrom a heat signal containing the AM information, and with the heat signal being conducted into the pyroelectric element to generate an electrical output signal containing the AM information. An electrically-insulating layer can be provided between the electrical resistor and the pyroelectric element for electrical isolation.

The pyroelectric element can comprise, for example, gallium nitride, lithium tantalate, PZT, PLZT, PVDF, TGS, or sodium nitrite. The exact thickness of a pyroelectric material within the pyroelectric element will, in general, depend upon a modulation bandwidth of the AM rf or microwave electrical signal and can be, for example, $\leq 2$ microns. The electrical resistor can comprise a layer which is generally $\leq 1$ micron thick, and can be formed from a resistive material such as tantalum nitride, nichrome, gold, copper, aluminum, tungsten or polycrystalline silicon which has been doped for electrical conductivity. The electrical resistor can have a resistance substantially equal to 50 Ohms. The heat sink can comprise a substrate material having a relatively high thermal conductivity such as silicon, silicon carbide, diamond, sapphire, ceramic, or metal.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
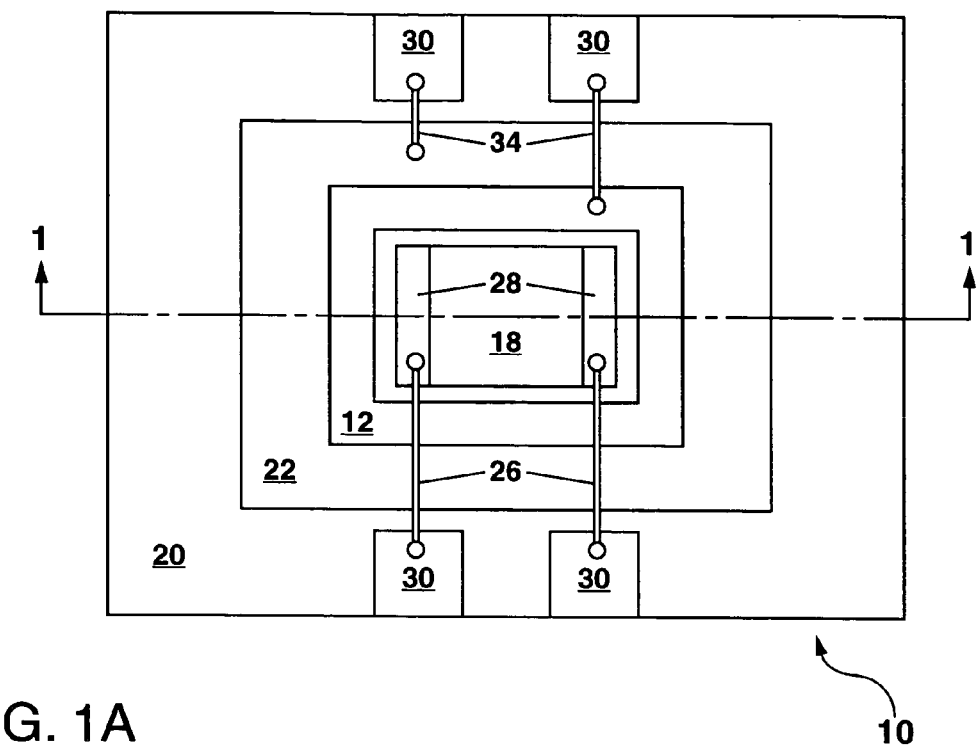
FIG. 1A shows a schematic plan view of a first example of the pyroelectric demodulator of the present invention.
Figure 1B:
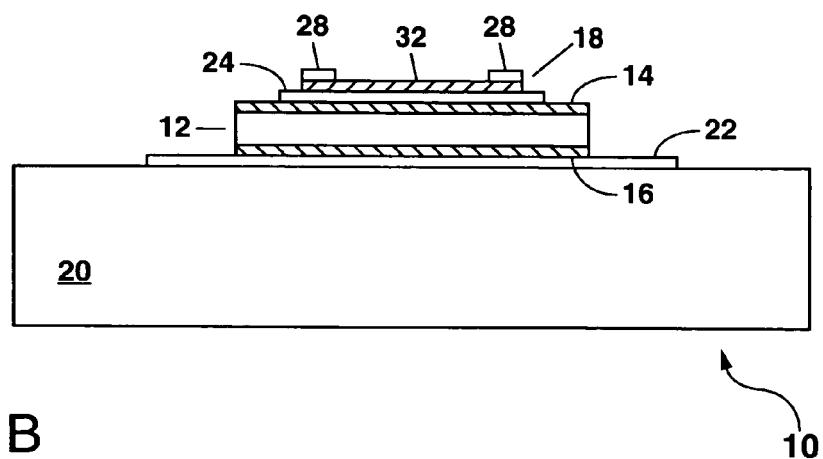
FIG. 1B shows a schematic cross-section view of the device of FIG. 1A along the section line 1-1 in FIG. 1A.

Referring to FIGS. 1A and 1B, there is schematically illustrated in plan view and in cross-section view, respectively, a first example of the pyroelectric demodulator 10 of the present invention. The pyroelectric demodulator 10 comprises a pyroelectric element 12 which has a pair of major surfaces 14 and 16, each of which has been metallized. In thermal communication with one major surface 14 is an electrical resistor 18; and in thermal communication with the other major surface 16 is a heatsink 20 (also referred to herein as a substrate) which can include a metallized surface 22 as shown in FIGS. 1A and 1B, or can be formed entirely of metal (e.g. aluminum, copper, gold, etc.).

The pyroelectric demodulator 10 of FIGS. 1A and 1B can be formed as a hybrid device with the pyroelectric element 12 being attached to the heatsink 20 (e.g. with solder or an electrically-conductive epoxy), and with the electrical resistor 18 being attached to the pyroelectric element 12. An electrically-insulating layer 24 (e.g. an adhesive such as epoxy, silicon dioxide or silicon nitride) can be used to provide electrical isolation between the resistor 18 and the pyroelectric element 12. When the electrically-insulating layer 24 comprises an adhesive, the adhesive can be used to directly attach the resistor 18 to the pyroelectric element 12. When silicon dioxide or silicon nitride is used as the electrically-insulating layer 24, these materials can be deposited over the pyroelectric element 12 and then the electrical resistor 18 can be deposited directly onto the electrically-insulating layer 24, or attached thereto with an adhesive. Alternately, the device 10 of FIGS. 1A and 1B can be formed entirely as a monolithic device by depositing and patterning a plurality of material layers one upon the other to build up the device 10 layer by layer as will be described in detail hereinafter.

In the pyroelectric demodulator 10 of FIGS. 1A and 1B, an AM electrical signal to be detected (i.e. demodulated) can be provided to the electrical resistor 18. This can be done using a pair of electrical input connections 26 (i.e. wires or deposited metal traces) which are suspended, at least in part, above the heatsink 20 to minimize heat transfer from the resistor 18 to the heatsink 20 through the electrical input connections 26. Each electrical input connection 26 can be connected between a terminal 28 on the electrical resistor 18 and a contact pad 30 on the heatsink 20. The AM electrical signal which is input to the electrical resistor 18 comprises a carrier frequency $\omega_c$ which has information impressed thereon by amplitude modulation.

The AM electrical signal is dissipated within the electrical resistor 18 and is entirely converted into heat to generate an AM heating signal which follows the AM information contained within the AM electrical signal, but which is not responsive to the higher carrier frequency $\omega_c$. This high responsivity of the heating signal to the AM information and relatively low responsivity to the carrier frequency $\omega_c$ can be tailored by an appropriate sizing of the electrical resistor 18 and its material and thermal characteristics. The electrical resistor 18 can comprise a thin (e.g. ≦1 μm thick) resistive layer 32 of a metal such as tantalum nitride, nickel chromium (also termed nichrome), gold, copper, aluminum, or tungsten. Alternately, the electrical resistor 18 can comprise a semiconductor such as polycrystalline silicon (also termed polysilicon) which is doped to provide a predetermined level of electrical resistivity (e.g. 50Ω) with an impurity dopant such as boron or phosphorous. Capacitive coupling of the AM electrical signal into the pyroelectric element 12 can also be minimized by making the resistive layer 32 and or the electrically-insulating layer 24 several times thicker than a "skin depth" at the carrier frequency $\omega_c$. The term "skin depth" refers to a depth which an rf signal at a particular frequency will penetrate into an electrically-conductive material.

Since the electrical resistor 18 is effectively thermally isolated in all directions except in a downward direction through the pyroelectric element 12, the AM heating signal is forced to travel down through the pyroelectric element 12 and into the heatsink 20. In traveling from the electrical resistor 18 down into the pyroelectric element 12, the AM heating signal will create a changing temperature difference ΔT across a pyroelectric material between the two metallized surfaces 14 and 16 within the pyroelectric element 12. This changing temperature difference ΔT will, in turn, generate an electrical output signal in the pyroelectric element 12 between the two metallized surfaces 14 and 16 which will contain the AM information from the electrical signal applied across the resistor 18. The electrical output signal can be provided to additional contact pads 30 on the heatsink 20 by a pair of electrical output connections 34.

In the example of FIGS. 1A and 1B, the pyroelectric element 12 performs the demodulation of the AM electrical signal which is inputted into the resistor 18 by converting a temperature difference ΔT between the resistor 18 and the heatsink 20 into an electrical output voltage as constituent atoms within the pyroelectric material move back and forth in response to changes in temperature produced by the AM heating signal.

The thickness of the pyroelectric material in the pyroelectric element 12 between the metallized surfaces 14 and 16 can be selected so that conduction of the AM heating signal through the pyroelectric element 12 to the underlying heatsink 20 occurs at a rate which is sufficient for a modulation bandwidth of the information to be recovered from the AM electrical signal inputted into the resistor 18. The rate at which heat conduction through the pyroelectric element 12 occurs can be selected, for example, to be resonant with the modulation bandwidth of the information to be recovered. This can be done by selecting the thickness of the pyroelectric material within the element 12. In general, a higher modulation bandwidth will require a thinner pyroelectric element 12.

When the thickness of the pyroelectric material within the pyroelectric element 12 is very small (e.g. ≦2 μm) to provide a modulation bandwidth in the GHz range for operation with a carrier frequency up to about 10 GHz, the heat flux q across the pyroelectric material is governed by an equation of phonon radiative transfer given by:

$$q = \frac{\sigma(T_1^4 - T_0^4)}{\frac{3}{4}\left(\frac{L}{l}\right) + 1}$$

where σ is the Stefan-Boltzmann constant of radiative heat transfer, $T_1$ is the temperature on one side of the pyroelectric material, $T_0$ is the temperature on the other side of the pyroelectric material, L is the thickness of the pyroelectric material, and l is the phonon mean free path within the pyroelectric material. Further information on the equation of phonon radiative transfer (EPRT) can be found in an article by A. Majumdar, "Microscale Heat Conduction in Dielectric Thin Films," *Journal of Heat Transfer*, vol. 115, pp. 7-16, 1993, which is incorporated herein by reference.

For a thickness L of the pyroelectric material which is about equal to the phonon mean free path l or less, heating incident at one side of the pyroelectric material will travel through the pyroelectric material at a speed which is about 57% of the acoustic velocity $v_a$ in the pyroelectric material. Additionally, there will be a time lag of approximately one picosecond in converting a temperature difference $\Delta T$ across the pyroelectric material into a voltage difference between the metallized surfaces 14 and 16 of the pyroelectric element 12. As an example, consider a pyroelectric demodulator 10 comprising a pyroelectric element 12 formed with a 1.5 μm thick layer of gallium nitride (GaN) for which $v_a$=5800 m-s$^{-1}$. In such a device 10, the thermal transport is governed by the equation of phonon radiative transfer with a thermal time constant in the GaN equal to 450 picoseconds [i.e. $L/(0.57v_a)$] so that a demodulation bandwidth of this device 10, which is inversely related to the thermal time constant, would be equal to about 2.2 GHz.

As another example, a pyroelectric demodulator 10 suitable for demodulating a received UWB AM electrical signal having a 25% bandwidth (i.e. 1.6 GHz bandwidth) centered at a carrier frequency of 6.5 GHz in the 3.1-10.6 GHz UWB frequency band allocated by the FCC for commercial use can be formed with a pyroelectric element 12 having a pyroelectric material thickness of approximately 2 μm when GaN is used as the pyroelectric material. For other pyroelectric materials such as lithium tantalate, PZT, PLZT, PVDF, TGS, sodium nitrite, etc., the exact thickness L of the pyroelectric material needed for demodulating an AM electrical signal with a predetermined signal bandwidth $\Delta f$ can be determined from the acoustic velocity $v_a$ for these materials using the equation:

$$L = \frac{0.57 v_a}{\Delta f}$$

when the thickness L of the pyroelectric material is about equal to the mean free path of phonons l or less.

For cases where the thickness L of the pyroelectric material is appreciably larger than the mean free path of phonons l, the heat transport through the pyroelectric material can be determined from the general three-dimensional heat flow equation for the temperature T given by:

$$\nabla^2 T + \tau_T \cdot \frac{\partial}{\partial t}[\nabla^2 T] + \frac{1}{k} \cdot \left[Q + \tau_q \cdot \frac{\partial Q}{\partial t}\right] = \frac{1}{\alpha} \cdot \frac{\partial T}{\partial t} + \frac{\tau_q}{\alpha} \cdot \frac{\partial^2 T}{\partial t^2}$$

where Q is the heat source, in W-m$^3$ (i.e. the AM heating signal produced by the electrical resistor 18), $\alpha$ is the thermal diffusivity of the pyroelectric material in the element 12, $\tau_T$ is the inverse of the phase lag of the temperature gradient, $\tau_q$ is the inverse of the phase lag of heat flux, and k is the thermal conductivity of the pyroelectric material. Additional parameters for determining the heat flow through a given pyroelectric material include the density $\rho$, heat capacity $C_p$, phonon mean free path l, and acoustic velocity $v_a$. Further details of the thermal transport through materials governed by the general three-dimensional heat flow equation above can be found in a book by D. Y. Tzou entitled *Macro-to Microscale Heat Transfer: The Lagging Behavior* (Taylor and Francis Publishing Co., 1997, pp. 1-34), which is incorporated herein by reference.

In the case of GaN, the heat flux time delay $\tau_q$ is about 4 picoseconds at room temperature, and only increases slightly at an elevated temperature of 150° C. The temperature gradient time delay $\tau_T$ is also comparable to q. Since the time delays $\tau q$ and $\tau_T$ are both much smaller than the 450 picosecond thermal time constant of GaN, the general three-dimensional heat flow equation for the temperature T above for thicker (L≫l) pyroelectric materials reduces to:

$$\nabla^2 T + \frac{1}{k} Q = \frac{1}{\alpha} \cdot \frac{\partial T}{\partial t}$$

where the heat Q provided by the electrical resistor 18 serves as an excitation source for heat transfer to the pyroelectric material, and the resulting temperature profile across the pyroelectric material follows the well-known Fourier diffusion model. Using this equation, a GaN pyroelectric demodulator 10 can be formed which is suitable for demodulating AM electrical input signals having a modulation bandwidth in the range of about 10 MHz-1 GHz.

The response time of the pyroelectric demodulator 10 of the present invention is not limited by the pyroelectric material, which responds to a change in temperature and rearranges its crystal lattice on a time scale on the order of 1 picosecond, but instead is limited by electrical parameters such as capacitance and inductance, and by the heating response time of the resistor 18. In addition to having a response time which can be tailored by the size and thickness of the pyroelectric material and the overlying resistor 18, the pyroelectric demodulator 10 can provide a relatively large electrical output signal, thereby overcoming limitations of conventional demodulators based on "square-law" detection.

As an example, the pyroelectric coefficient $P_V$ of GaN along the c-axis is reported to be 7×10$^5$ Volts-meter$^{-1}$ per degree Kelvin of temperature difference $\Delta T$ across the GaN pyroelectric material. For a pyroelectric element 12 having a 2-μm-thick layer of GaN pyroelectric material, the above value of $P_V$ would be expected to provide a theoretical output voltage of 1.4 Volts if the temperature difference across the GaN pyroelectric material were 1° C. Such a temperature difference could theoretically be produced by a 0.5 μm thick polysilicon 50Ω resistor 18 with a 10 μm square size and 116 picogram mass based on the heat capacity of silicon which is about 0.7 J-gm$^{-1}$° C.$^{-1}$ and using an electrical input power of about 80 picoJoules which is equivalent to an AM electrical input signal with 90 microVolts of peak-to-peak voltage or 64 microVolts root-mean-square (rms) voltage. This simplified calculation assumes that the resistor 18 is thermally isolated so that all of the heat produced in the resistor 18 flows through the pyroelectric element 12. Even if there are inefficiencies and thermal losses not taken into account in the above simplified calculation, the pyroelectric demodulator 10 of the present invention should still be able to provide a net voltage gain in demodulating an AM electrical input signal, thereby providing an advantage over conventional demodulators.

Returning to the example of the pyroelectric demodulator 10 in FIGS. 1A and 1B, this device 10 can be fabricated on many different types of substrates 20, which preferably have a relatively high heat conductivity, including substrates comprising silicon, silicon carbide, diamond, sapphire, ceramic, and metal. The primary characteristic required for the substrate 20 is a relatively high thermal conductivity to efficiently and quickly remove heat from the pyroelectric element 12. Those skilled in the art will understand that other types of substrates than those specifically mentioned above can be used for practice of the present invention. Additionally, although a single device 10 is shown and described herein, those skilled in the art will understand that a plurality of pyroelectric demodulators 10 can be formed on a common substrate 20. This can be done to demodulate a plurality of channels of rf or microwave signals (e.g. in a multi-channel receiver). This also allows fabrication costs to be reduced by using batch fabrication processes to fabricate a plurality of individual devices 10 on the common substrate 20 and subsequently to separate out the individual devices 10 (e.g. by sawing or dicing) for individual packaging thereof.

When the pyroelectric demodulator 10 is formed as a hybrid device, the size of the pyroelectric element 12 can range from a few millimeters lateral dimensions and about 0.1 mm thickness down to a few tens of microns lateral dimensions and a few hundred nanometers thickness. Such devices 10 are expected to be suitable for use with carrier frequencies in the 100 kHz to about 1 GHz range, and with modulation bandwidths up to several MHz or more.

Smaller devices 10, which are suitable for operation with modulation bandwidths and carrier frequencies in the GHz range (i.e. up to a few GHz modulation bandwidth and 10 GHz carrier frequency) can be monolithically fabricated on the substrate 20. This can be done, for example, by depositing one or more metal layers over the substrate 20 and patterning the metal layers by reactive ion etching to form a lower electrical contact for the pyroelectric element 12. The metal layers can comprise, for example, a layer of titanium up to a few tens of nanometers thick followed by a layer of platinum up to a few hundred nanometers thick. The titanium and platinum layers can be sputter deposited over the substrate 20.

The pyroelectric material can then be deposited over the metal layers on the substrate 20. This can be done, for example, by spin coating a commercially available polymerizable sol-gel precursor solution containing metal cations of lead, zirconium and titanium (e.g. available from Mitsubishi Materials Corp.) to provide a layer about 40-50 nm thick which can then be dried and pyrolyzed on a hot plate in air at about 400° C. for one minute to form a PZT layer. A seed layer of lead titanate (PT) can be optionally spun onto the substrate 20 and pyrolyzed at 400° C. prior to forming the PZT layer to enhance perovskite formation in the PZT layer, thereby improving the quality of the PZT layer and all subsequently-deposited PZT layers.

Subsequent PZT layers can be similarly spin coated over the substrate 20 and pyrolyzed to build up the thickness of the pyroelectric material. After deposition and pyrolysis of a few layers of the PZT, a rapid thermal annealing step can be performed at a temperature of about 700° C. in an oxygen ambient. This process of spin coating, pyrolysis and annealing can be repeated, as needed, to build up the pyroelectric material to a predetermined overall thickness $\leq 2$ μm depending upon the modulation bandwidth desired for the pyroelectric demodulator 10.

Further details of sol-gel deposition of PZT can be found in an article by T. G. Cooney et al., "Processing of Sol-Gel Derived PZT Coatings on Non-Planar Substrates,"*Journal of Micromechanics and Microengineering*, vol. 6, pp. 291-300, 1996; and in another article by A. A. Talin et al., "Epitaxial PbZr$_{0.52}$Ti$_{0.48}$O$_3$ films on SrTiO$_3$/(001)Si Substrates Deposited by Sol-Gel Method," *Applied Physics Letters*, vol. 81, pp. 1062-1064, 5 Aug. 2002, both of which are incorporated herein by reference. Those skilled in the art will understand that PLZT and lithium tantalate can also be formed by sol-gel deposition in a manner similar to that described above, and as described in more detail in the references cited above. Additionally, those skilled in the art will understand that there are other methods well-known to the art for depositing pyroelectric materials such as PZT, PLZT, lithium tantalate, PVDF, TGS and sodium nitrite including sputter deposition, pulsed laser deposition (PLD), metal-organic chemical vapor deposition (MOCVD), and electro-spray deposition (ESD). If the pyroelectric material is not adequately poled during deposition, poling can be performed after fabrication of the pyroelectric demodulator 10 is completed. Poling aligns domains within the pyroelectric material along a preferred polar axis by applying a voltage of generally less than 20 Volts across the pyroelectric element 12. This can be done while the pyroelectric element 12 is heated up near to or above the Curie temperature of the pyroelectric material.

After the pyroelectric material has been formed, an upper contact metallization comprising platinum or chromium and platinum up to a few hundred nanometers thick can be sputter deposited over the pyroelectric material. Reactive ion etching can be used to pattern the pyroelectric material and the upper contact metallization.

A layer 24 of an electrically-insulating material such as silicon dioxide or silicon nitride can then be deposited over the upper contact metallization to electrically insulate the upper contact metallization of the pyroelectric element 12 from the electrical resistor 18 which will be formed on top of the pyroelectric element 12. The electrically-insulating layer 24 can be up to a few hundred nanometers thick.

The electrical resistor 18 can then be formed over the electrically-insulating layer 24 by depositing and patterning the resistive layer 32 comprising tantalum nitride, nichrome, gold, copper, aluminum, tungsten, or doped polysilicon. These materials forming the resistive layer 32 can be deposited by sputtering or chemical vapor deposition. The terminals 28 for the electrical resistor 18 can be formed, for example, from sputter-deposited layers of nichrome, palladium and gold. After deposition the resistance of the electrical resistor 18 can be stabilized by heating of the resistor 18 to an elevated temperature of a few hundred ° C. Additionally, the resistive film 32 can be laser trimmed, if needed, to provide a resistance of about 50 Ohms.

When the lateral dimensions and thickness of the pyroelectric element 12 and the electrical resistor 18 become very small (e.g. less than about 50 μm on a side) then deposited and patterned metallizations (also termed traces) can be used for the electrical input and output connections 26 and 34. The use of patterned metallizations substantially reduces the cross-sectional area of the connections 26 and 34 since the metallizations can be a fraction of a micron thick (e.g. 0.2-0.3 μm), and can have a width of, for example, 1-2 μm. Additionally, the connections 26 and 34 can be formed as air bridges suspended above the substrate 20 to further reduce the heat loss through the connections 26. This is schematically illustrated in a second example of the pyroelectric demodulator 10 of the present invention in FIGS. 2A and 2B.

Figure 2A:
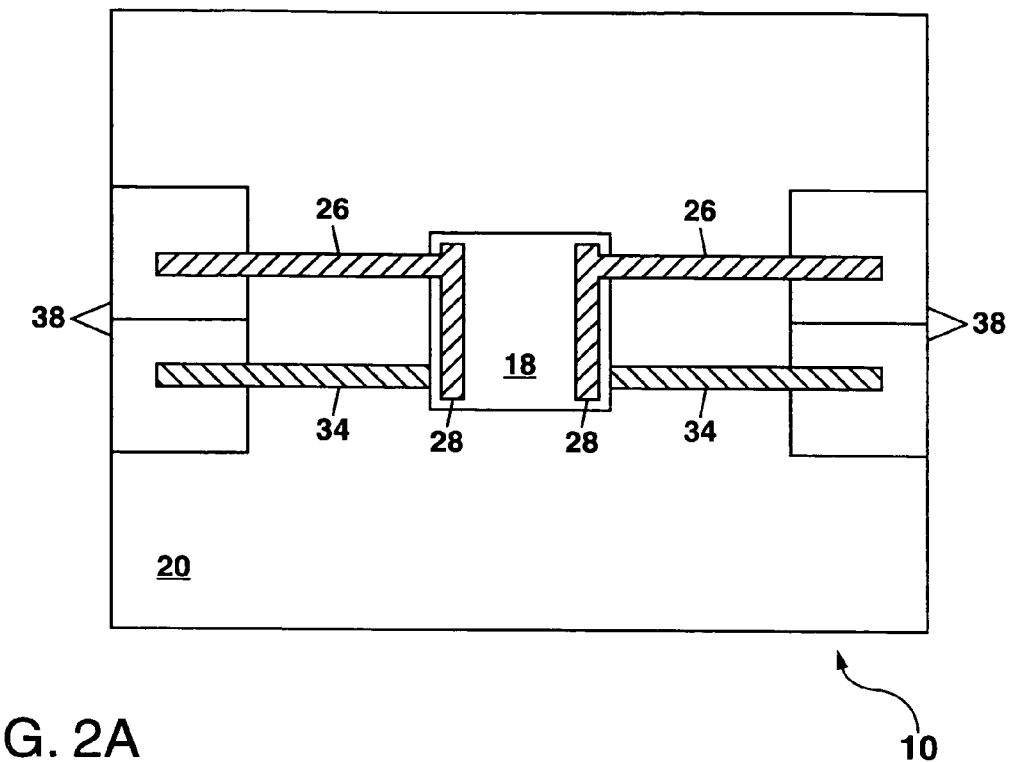
FIGS. 2A and 2B show schematic plan and cross-section views, respectively, of a second example of the pyroelectric demodulator of the present invention.
Figure 2B:
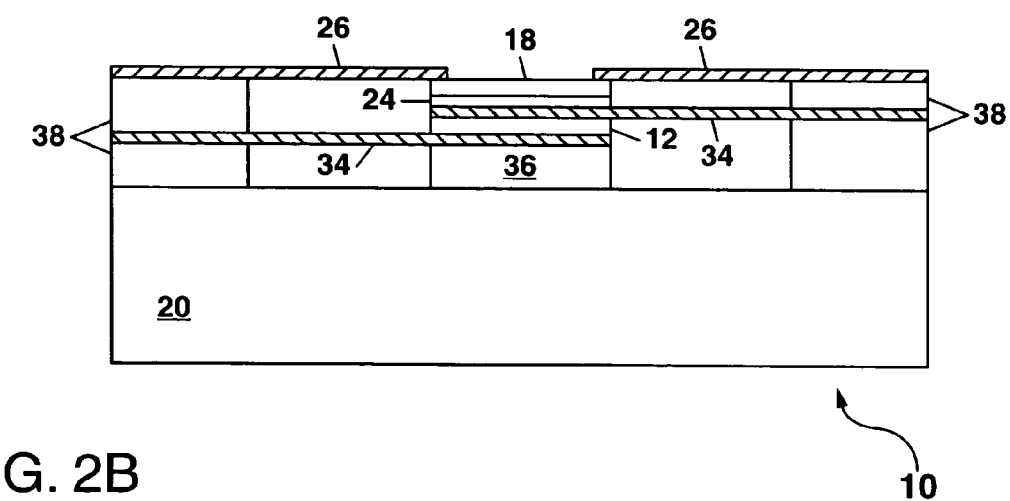

The second example of the pyroelectric demodulator 10, which is shown schematically in plan view in FIG. 2A and in cross-section view in FIG. 2B, can be formed on a substrate 20 which can comprise, for example, silicon, silicon carbide, diamond, sapphire, ceramic, or metal. The pyroelectric element 12 can be formed on the substrate 20, or alternately on a pedestal 36 as schematically illustrated in FIG. 2B. The pedestal 36, which can be formed from the substrate 20 (e.g. by etching away a portion of the substrate 20) or deposited thereon (e.g. as a layer of polycrystalline silicon, silicon nitride, silicon carbide, diamond or a diamond-like material, etc.) can be used to electrically isolate the pyroelectric element 12 from the substrate 20 and to ensure a substantially vertical flow of heat from the electrical resistor 18 through the pyroelectric element 12 and to the underlying substrate 20.

In the example of FIGS. 2A and 2B, the pyroelectric demodulator 10 can be built up on the substrate layer by layer, with a sacrificial material (e.g. silicon dioxide or a silicate glass, or alternately polysilicon) being provided underneath the input and output connections 26 and 34 at locations where the air bridges are to be formed, and with spacers 38 being provided to support a terminal end of each input and output connection 26 or 34. The spacers 38 can be formed, for example, from silicon nitride when the sacrificial material comprises silicon dioxide or a silicate glass such as TEOS which is deposited from the decomposition of tetraethylortho silicate using low-pressure chemical vapor deposition (LPCVD). When the sacrificial material comprises polysilicon, the spacers 38 can be formed from silicon dioxide or a silicate glass (e.g. TEOS). The sacrificial material and spacers 38 can be deposited by MOCVD, LPCVD, or plasma-enhanced chemical vapor deposition (PECVD), and patterned using reactive ion etching.

In the example of FIGS. 2A and 2B, external electrical connections can be made to the terminal end of the input and output connections 26 and 34, or the connections 26 and 34 can be extended to form electrical connections to other components located on the substrate 20. As an example, the demodulated electrical output signal from the pyroelectric element 12 can be connected to an amplifier or a signal processor located on the substrate 20 via the output connections 34. The amplifier or signal processor can be formed, for example, using well-known complementary metal-oxide semiconductor (CMOS) technology.

Figure 3A:
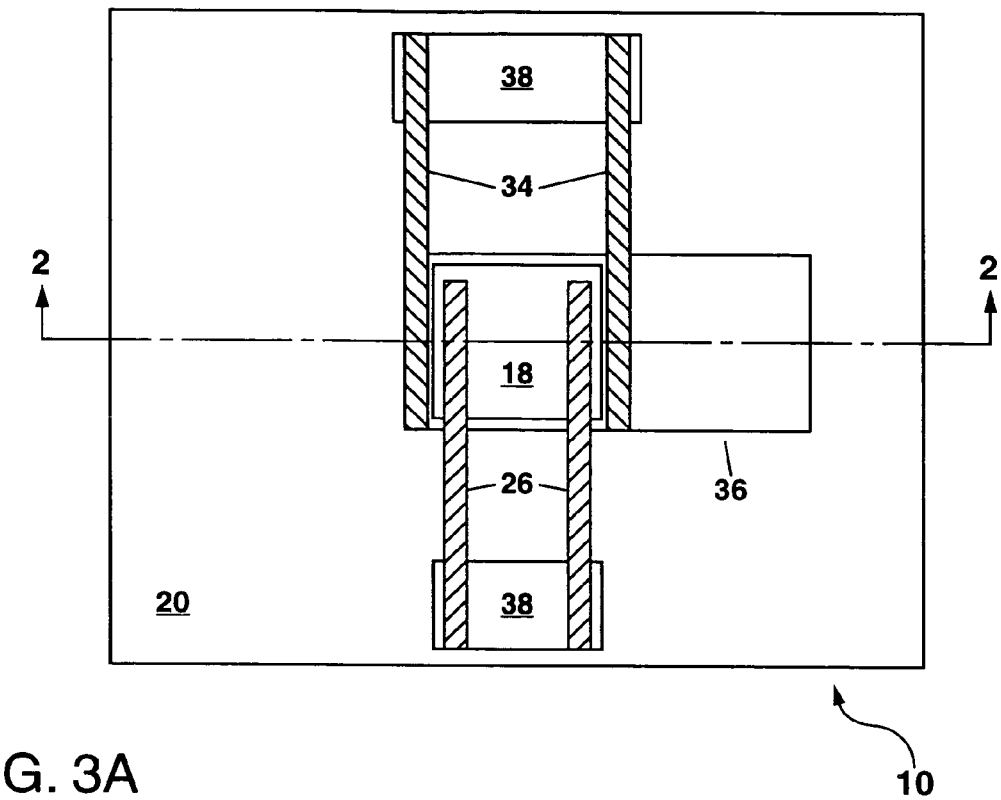
FIG. 3A shows a schematic plan view of a third example of the pyroelectric demodulator of the present invention.
Figure 3B:
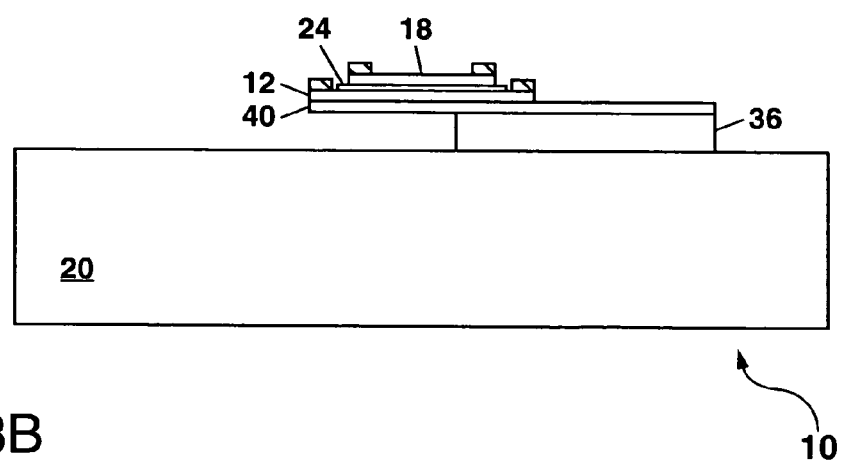
FIG. 3B shows a schematic cross-section view of the device of FIG. 3A along the section line 2-2 in FIG. 3A.

FIGS. 3A and 3B show another example of the pyroelectric demodulator 10 of the present invention. In FIGS. 3A and 3B, the pyroelectric element 12 is formed on a cantilever 40 extending outward from a pedestal 36, with the pyroelectric material in the element 12 being poled in a direction substantially parallel to the substrate 20. This arrangement allows one side of the pyroelectric element 12 to be heat-sinked to the pedestal 36 and substrate 20 while the other side of the pyroelectric element 12 is thermally isolated on the cantilever 40. The pyroelectric demodulator 10 of FIGS. 3A and 3B operates by sensing a temperature difference $\Delta T$ produced across the width of the pyroelectric element 12 due to heating produced by the AM electrical signal input into the electrical resistor 18.

In FIGS. 3A and 3B, the cantilever 40 can comprise a material such as silicon or silicon nitride. As an example, a silicon-on-insulator (SOI) substrate 20 can be used, with the cantilever 40 being formed from a monocrystalline silicon layer, and with the pedestal 36 being formed from an oxide layer (e.g. silicon dioxide) in the SOI substrate 20 which separates the monocrystalline silicon layer from a monocrystalline silicon body. As another example, the pedestal 36 can be built up from a deposited layer of polysilicon or silicon nitride, with the cantilever 40 being formed from another deposited layer of polysilicon or silicon nitride. A sacrificial material such as silicon dioxide or a silicate glass can be provided underneath the cantilever 40 and later removed so that the cantilever 40 is free standing. The exact thickness of the cantilever 40 will, in general, depend upon the size and thickness of the pyroelectric element 12 and can be, for example, up to a few microns.

After the pyroelectric element 12 and the electrical resistor 18 have been built up as previously described, a portion of the pedestal 36 can be undercut with a selective wet etchant (e.g. comprising hydrofluoric acid when the pedestal 36 comprises silicon dioxide). Similarly, when a sacrificial material is provided beneath the cantilever 40, the sacrificial material can be removed with the selective wet etchant. After fabrication is completed, the pyroelectric material in the pyroelectric demodulator 10 can be horizontally poled by applying a voltage across the output electrical connections 34 with the device 10 heated near to or above the Curie temperature of the pyroelectric material.

Figure 4A:
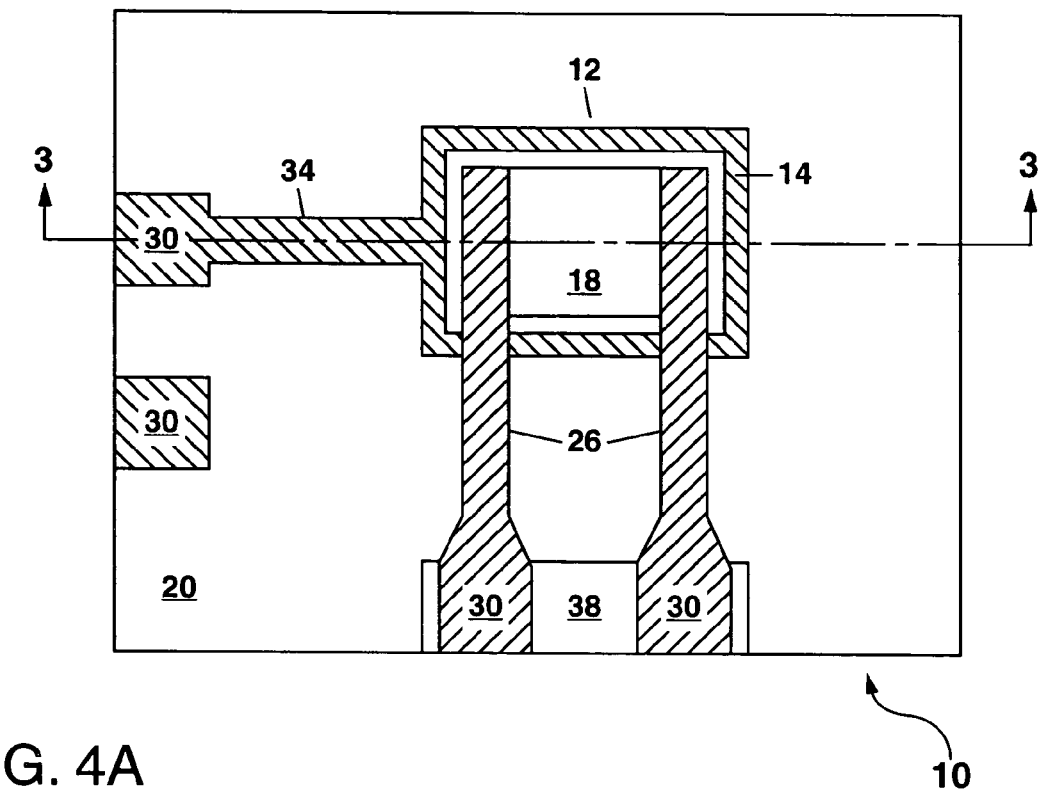
FIG. 4A shows a schematic plan view of a fourth example of the pyroelectric demodulator of the present invention.
Figure 4B:
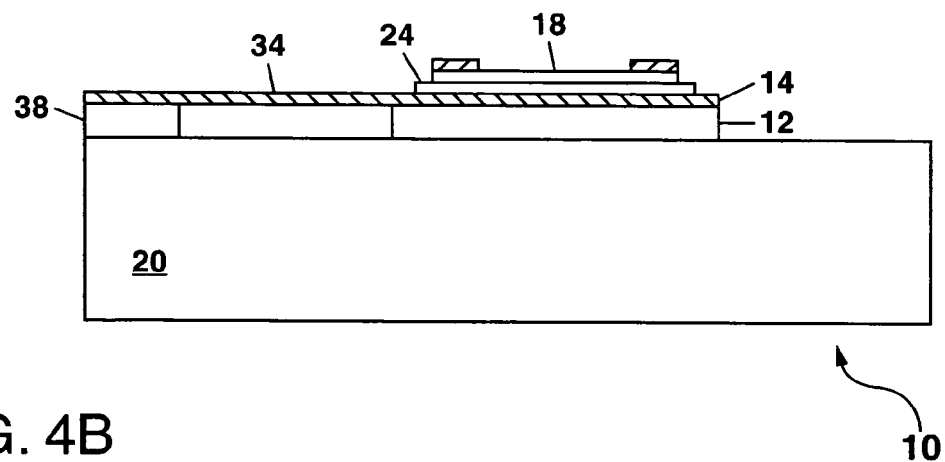
FIG. 4B shows a schematic cross-section view of the device of FIG. 4A along the section line 3-3 in FIG. 4A.

A fourth example of the pyroelectric demodulator 10 of the present invention is schematically illustrated in FIGS. 4A and 4B. In this device, the pyroelectric element 12 is epitaxially grown upon the substrate 20. The pyroelectric element 12 can comprise, for example, a semiconductor pyroelectric material such as gallium nitride (GaN) which can be epitaxially grown on a silicon carbide or sapphire substrate. A silicon carbide substrate 20 can be doped for electrical conductivity to facilitate making a electrical connection to a lower surface of the GaN pyroelectric material which can be doped (e.g. n-type doped) during epitaxial growth. Epitaxial growth of GaN is well-known in the art (see e.g. U.S. Pat. No. 6,599,362; an article by C. I. H. Ashby et al., "Low-Dislocation-Density GaN from a Single Growth on a Textured Substrate," *Applied Physics Letters*, vol. 77, pp. 3233-3235, 13 Nov. 2000; and a review article by O. Ambacher, "Growth and Applications of Group III-Nitrides," *Journal of Physics D: Applied Physics*, vol. 31, pp. 2653-2710, 1998; all of which are incorporated herein by reference).

After epitaxial growth and patterning of the GaN pyroelectric element 12, the remainder of the pyroelectric device 10 can be built up as previously described using a series of deposition and patterning steps to form the input and output electrical connections 26 and 34, the electrical resistor 18, and an electrically-insulating layer 24 separating the resistor 18 from an upper metallized surface 14 of the pyroelectric element 12.

The device 10 of FIGS. 4A and 4B provides suspended air-bridge strip-line electrical input connections 26 to allow operation at GHz carrier frequencies while minimizing the heat loss through these connections 26. The upper metallized surface 14 of the pyroelectric element 12 is also connected to an air-bridge output electrical connection 34, while a lower surface of the pyroelectric element 12 can be connected through the substrate 20 to a contact pad 30 formed on the substrate.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A pyroelectric demodulator for demodulating an amplitude-modulated electrical signal to remove modulation at a carrier frequency and recover amplitude-modulated information, comprising:
   an electrical resistor to receive the amplitude-modulated electrical signal and to generate therefrom an amplitude-modulated heating signal in the electrical resistor which is substantially free from any signal at the carrier frequency; and
   a pyroelectric element in thermal communication with the electrical resistor to receive the amplitude-modulated heating signal and to generate therefrom an electrical output signal containing the amplitude-modulated information.

2. The pyroelectric demodulator of claim 1 further comprising a substrate, with the pyroelectric element being in thermal communication with the substrate.

3. The pyroelectric demodulator of claim 2 wherein the substrate comprises a substrate material selected from the group consisting of silicon, silicon carbide, diamond, sapphire, ceramic and metal.

4. The pyroelectric demodulator of claim 2 wherein one side of the pyroelectric element is attached to the substrate, and the electrical resistor is attached to another side of the pyroelectric element.

5. The pyroelectric demodulator of claim 2 wherein the electrical resistor comprises a pair of electrical input connections which are suspended, at least in part, above the substrate.

6. The pyroelectric demodulator of claim 5 wherein the pyroelectric element comprises at least one electrical output connection which is suspended, at least in part, above the substrate.

7. The pyroelectric demodulator of claim 1 wherein the electrical resistor comprises a layer of a resistive material selected from the group of resistive materials consisting of tantalum nitride, nickel chromium (nichrome), gold, copper, aluminum, tungsten and doped polycrystalline silicon.

8. The pyroelectric demodulator of claim 7 wherein the layer of the resistive material is located on a major surface of the pyroelectric element and electrically insulated therefrom by an intervening electrically-insulating layer.

9. The pyroelectric demodulator of claim 7 wherein the electrical resistor has a resistance substantially equal to 50 Ohms.

10. The pyroelectric demodulator of claim 1 wherein the pyroelectric element comprises a pyroelectric material selected from the group consisting of gallium nitride, lithium tantalate, lead zirconate titanate (PZT), lead lanthanum zirconate titanate (PLZT), polyvinylidene fluoride (PVDF), triglycine sulfate (TGS), and sodium nitrite.

11. The pyroelectric demodulator of claim 1 wherein the pyroelectric element comprises a pyroelectric material with a thickness of ≦2 microns.

12. The pyroelectric demodulator of claim 1 wherein the pyroelectric element is supported on a cantilever.

13. The pyroelectric demodulator of claim 1 wherein the carrier frequency is less than or equal to 10 GHz.

14. The pyroelectric demodulator of claim 13 wherein the modulation bandwidth is at least twenty-five percent of the carrier frequency.

15. A pyroelectric demodulator for demodulating an amplitude-modulated radio-frequency (rf) or microwave electrical signal to recover amplitude-modulated information therefrom, comprising:
   a pyroelectric element having a pair of major surfaces;
   a heat sink in thermal communication with one of the pair of major surfaces of the pyroelectric element; and
   an electrical resistor in thermal communication with the other of the pair of major surfaces of the pyroelectric element to receive the amplitude-modulated rf or microwave electrical signal and to generate therefrom a heat signal containing the amplitude-modulated information, and with the heat signal being conducted into the pyroelectric element to generate an electrical output signal containing the amplitude-modulated information.

16. The pyroelectric demodulator of claim 15 wherein the pyroelectric element comprises a pyroelectric material selected from the group consisting of gallium nitride, lithium tantalate, lead zirconate titanate (PZT), lead lanthanum zirconate titanate (PLZT), polyvinylidene fluoride (PVDF), triglycine sulfate (TGS), and sodium nitrite.

17. The pyroelectric demodulator of claim 15 wherein the pyroelectric element comprises a pyroelectric material with a thickness of ≦2 microns.

18. The pyroelectric demodulator of claim 15 wherein the heat sink comprises a substrate material selected from the group consisting of silicon, silicon carbide, diamond, sapphire, ceramic, and metal.

19. The pyroelectric demodulator of claim 15 further comprising an electrically-insulating layer disposed between the electrical resistor and the pyroelectric element to electrically isolate the electrical resistor from the pyroelectric element.

20. The pyroelectric demodulator of claim 15 wherein the electrical resistor comprises a layer which is ≦1 micron thick of a resistive material selected from the group of resistive materials consisting of tantalum nitride, nickel chromium (nichrome), gold, copper, aluminum, tungsten and doped polycrystalline silicon.

21. The pyroelectric demodulator of claim 15 wherein the electrical resistor has a resistance substantially equal to 50 Ohms.

* * * * *